(12) United States Patent
Zhao (10) Patent No.: US 10,347,747 B2
(45) Date of Patent: Jul. 9, 2019

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Meng Zhao, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 15/658,623

(22) Filed: Jul. 25, 2017

(65) Prior Publication Data

US 2018/0047829 A1 Feb. 15, 2018

(30) Foreign Application Priority Data

Aug. 12, 2016 (CN) .......................... 2016 1 0664178

(51) Int. Cl.
*H01L 29/66* (2006.01)
*H01L 21/225* (2006.01)
(Continued)

(52) U.S. Cl.
CPC .... *H01L 29/66681* (2013.01); *H01L 21/2253* (2013.01); *H01L 21/266* (2013.01);
(Continued)

(58) Field of Classification Search
CPC .......... H01L 29/66681; H01L 21/2253; H01L 29/66659; H01L 29/7816; H01L 21/26513;
(Continued)

(56) References Cited

U.S. PATENT DOCUMENTS

| 2008/0122005 | A1* | 5/2008 | Horsky | ............. | H01L 21/26513 257/369 |
| 2008/0305598 | A1* | 12/2008 | Horsky | .................. | H01J 37/08 438/303 |

(Continued)

OTHER PUBLICATIONS

The European Patent Office (EPO) The Extended European Search Report for 17185485.4 dated Jan. 9, 2018 8 Pages.

*Primary Examiner* — Moin M Rahman
(74) *Attorney, Agent, or Firm* — Anova Law Group, PLLC (57) ABSTRACT

The present disclosure provides semiconductor structures and fabrication methods thereof. An exemplary fabrication method includes providing a substrate having a first region and a second region; forming a trench in the substrate in the first region; forming a compensation doping region in a side surface of the trench adjacent to the second region; forming an isolation structure in the trench; forming a well region in the substrate in the second region; forming a drift region in the substrate in the first region; forming a gate structure over the substrate in a boundary region between the first region and the second region, and covering a portion of the isolation structure; and forming a source region in the well region at one side of the gate structure and a drain region in the drift region at another side of the gate structure.

17 Claims, 5 Drawing Sheets

(51) Int. Cl.
 H01L 21/265 (2006.01)
 H01L 21/266 (2006.01)
 H01L 29/10 (2006.01)
 H01L 29/78 (2006.01)
 H01L 29/06 (2006.01)

(52) U.S. Cl.
 CPC .... H01L 21/2658 (2013.01); H01L 21/26513 (2013.01); H01L 21/26586 (2013.01); H01L 29/0653 (2013.01); H01L 29/1037 (2013.01); H01L 29/66659 (2013.01); H01L 29/7816 (2013.01); H01L 29/7835 (2013.01)

(58) Field of Classification Search
 CPC ........... H01L 29/7835; H01L 21/26586; H01L 21/266; H01L 29/1037; H01L 29/0653; H01L 21/2658
 See application file for complete search history.

(56) References Cited

U.S. PATENT DOCUMENTS

| | | |
|---|---|---|
| 2012/0094457 A1 | 4/2012 | Gabrys |
| 2012/0306014 A1* | 12/2012 | Camillo-Castillo ........................ H01L 29/66659 257/343 |
| 2016/0064552 A1* | 3/2016 | Cheng ................ H01L 29/7835 257/343 |

* cited by examiner

SEMICONDUCTOR STRUCTURE AND FABRICATION METHOD THEREOF

CROSS-REFERENCES TO RELATED APPLICATIONS

This application claims the priority of Chinese patent application No. 201610664178.5, filed on Aug. 12, 2016, the entirety of which is incorporated herein by reference.

FIELD OF THE DISCLOSURE

The present invention generally relates to the field of semiconductor technologies and, more particularly, relates to semiconductor structures and fabrication methods thereof.

BACKGROUND

Laterally double-diffused-metal-oxide semiconductor (LDMOS) transistors have the characteristics of high breakdown voltage, and compatibility with the complimentary MOS process; and have been widely used in power integrated circuits (ICs). Conventional MOS devices include source and drain that are symmetrical with respect to a gate structure, while, in a LDMOS transistor, the distance between the drain and the gate structure is greater than the distance between the source and the gate structure. Specifically, there is a relatively long lightly-doped region between the drain and the gate structure of the LDMOS transistor. Such a path is referred to as a drift region. When a high voltage is applied to the drain of the LDMOS device, the drift region is used to sustain a relatively high potential to obtain a relatively high breakdown voltage (BV).

The drive current (Ion) and the breakdown voltage are the two important parameters to evaluate the electrical properties of the LDMOS devices. The drive current refers to the current flowing from the drain to the source of the LDMOS device when the LDMOS device is in operation. The breakdown voltage refers to the maximum transient threshold voltage of a targeted terminal of the LDMOS device before the LDMOS device is broken down. A relatively large drive current and a relatively large breakdown voltage enable the LDMOS device to have a desired switching characteristic and a relatively strong drive ability.

However, it is desirable to improve the electrical properties of conventional LDMOS devices. The disclosed methods and semiconductor structures are directed to solve one or more problems set forth above and other problems in the art.

BRIEF SUMMARY OF THE DISCLOSURE

One aspect of the present disclosure includes a method for fabricating a semiconductor structure. The method includes providing a substrate having a first region and a second region; forming a trench in the substrate in the first region; forming a compensation doping region in a side surface of the trench adjacent to the second region; forming an isolation structure in the trench; forming a well region in the substrate in the second region; forming a drift region in the substrate in the first region; forming a gate structure over the substrate in a boundary region between the first region and the second region, and covering a portion of the isolation structure; and forming a source region in the well region at one side of the gate structure and a drain region in the drift region at another side of the gate structure.

Another aspect of the present disclosure includes a semiconductor structure. The semiconductor structure includes a substrate having a first region and a second region; an isolation structure formed in the substrate in the first region; a compensation doping region formed in the substrate in the first region, locate at a side of the isolation structure adjacent to the substrate in the second region and connecting with the isolation structure; a well region formed in the substrate in the second region; a drift region formed in the substrate in the first region and enclosing the isolation structure and the compensation doping region; a gate structure formed over the substrate in a boundary region between the first region and the second region; a source region formed in the well region at one side of the gate structure; and a drain region formed in the drift region at another side of the gate structure.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
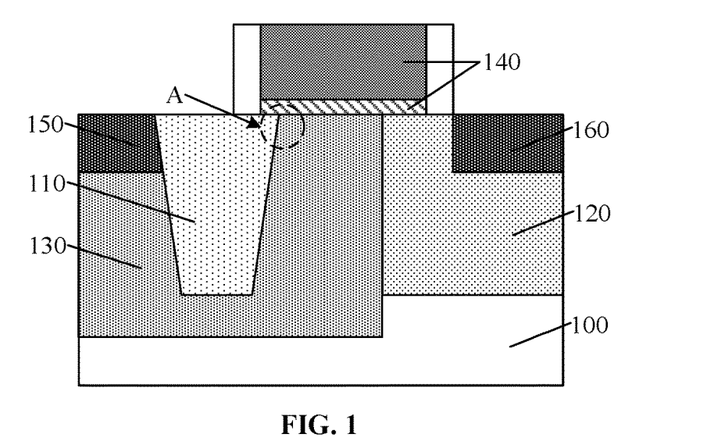
FIG. 1 illustrates a semiconductor structure.

FIG. 1 illustrates a method for forming a semiconductor structure. The semiconductor structure may be a P-type LDMOS device, for example.

As shown in FIG. 1, the semiconductor structure includes a substrate 100; a P-type drift region 130 and an N-type well region 120 formed in in the substrate 100; an isolation structure 110 formed in the drift region 130; a gate structure 140 formed on the substrate 100 and across the P-type drift region 130 and the N-type well region 120 and with a portion on the isolation structure 110; a drain 150 formed in the P-type drift region 130 at one side of the gate structure 140; and a source 160 formed in the N-type well region 120 at another side of the gate structure 140. The drain 150 and the source 160 are both P-type doped.

The isolation structure 110 is made of $SiO_2$, the segregation coefficients of $SiO_2$ and the channel region are different, especially P-type ions. Thus, the doping ions in P-type drift region 130 in the corner region enclosed by the isolation structure 110 under the gate structure 120 and the surface of the substrate 100 (the region A illustrated in FIG. 1) are easy to diffuse into the isolation structure 110. That is, the doping ions in the drift regions 130 at the corner region "A" may be easily deficient. Thus, a high resistance region may be formed at the corner region "A". Accordingly, the drive current of the LDMOS device is reduced.

To solve such an issue and other related issues, the present disclosure provides a semiconductor structure and a fabrication method thereof. The fabrication method includes providing a substrate having a first region used for forming a drift region and a second region used for forming a well region; forming a trench in the substrate in the first region; forming a compensation doping region having a first type of doping ions in the side surface of the trench adjacent to the second region; forming an isolation structure in the trench; forming a well region having a second type of doping ions with a conductive type opposite to a conductive type of the first type of doping ions in the substrate in the second region; forming a drift region having a third type of doping ions with a conductive type identical to the conductive type of the first type of doping ions in the substrate in the first region; forming a gate structure over the boundary region between the first region and the second region and to cover a portion of the isolation structure; and forming a source in the well region at one side of the gate structure and a drain in the drift region at the other side of the gate structure. The source and the drain may be doped with a fourth type of doping ions; and the conductive type of the fourth type of doping ions may be identical to the conductive type of the third type of doping ions.

In the present disclosure, after forming the trench in the substrate in the first region and before forming the isolation structure in the trench, a compensation doping region may be formed in the side surface of the trench at the side adjacent to the second region. That is, after subsequently forming the isolation structure in the trench, the compensation doping region may locate at one side of the isolation structure adjacent to the second region; and may connect with the isolation structure. After subsequently forming the drift region in the substrate in the first region, the doping type of the drift region may be identical to the doping type of the compensation doping region. The compensation doping region may compensate the drift region at the corner region enclosed by the side surface of the isolation structure and the surface of the substrate in the first region. Such a compensation may prevent the doping ions in the drift region at the corner region from excessively diffusing into the isolation structure to form a high resistance region. That is, the excessive doping ion loss in the drift region at the corner region for forming the high resistance region may be avoided. Thus, the drive current of the semiconductor structure may be increased; and the electrical properties of the semiconductor structure may be improved.

Figure 11:
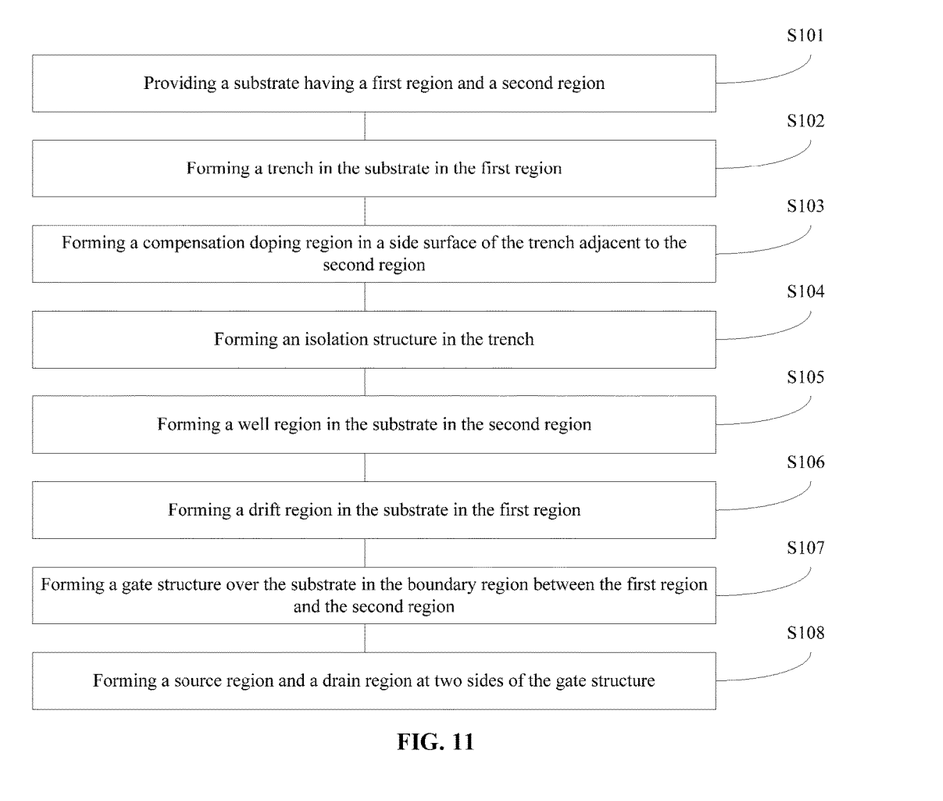
FIG. 11 illustrates an exemplary fabrication process of a semiconductor structure consistent with the disclosed embodiments.

FIG. 11 illustrates an exemplary fabrication process of a semiconductor structure consistent with the disclosed embodiments. FIGS. 2-9 illustrate semiconductor structures corresponding to certain stages of the exemplary fabrication process.

Figure 2:
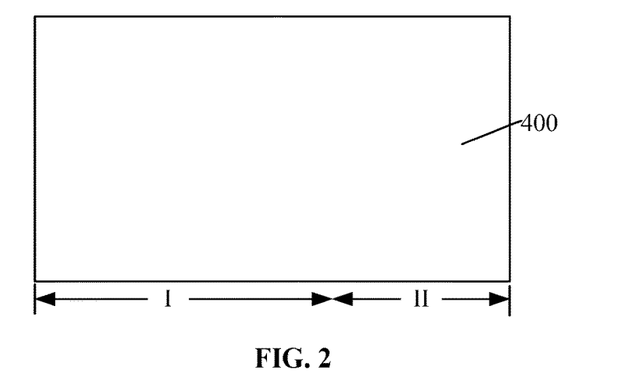
FIGS. 2-9 illustrate structures corresponding to certain stages of an exemplary fabrication process of a semiconductor structure consistent with the disclosed embodiments.

As shown in FIG. 11, at the beginning of the fabrication process, a substrate is provided (S101). FIG. 2 illustrates a corresponding semiconductor structure.

As shown in FIG. 2, a substrate 400 is provided. The substrate 400 may include a first region I and a second region II. The portion of the substrate 400 in the first region I may be used to subsequently form a drift region; and the portion of the substrate 400 in the second region II may be used to subsequently form a well region. The substrate 400 provides a process platform for forming the semiconductor structure.

In one embodiment, the substrate 400 may be used to form a P-type semiconductor structure. Specifically, the P-type semiconductor structure may be a P-type LDMOS device. In some embodiments, the substrate may be used to form an N-type LDMOS device.

In one embodiment, the substrate 400 is a silicon substrate. In some embodiments, the substrate 400 may be a germanium substrate, a silicon germanium substrate, a silicon carbide substrate, a silicon-on-insulator (SOI) substrate, a germanium-on-insulator (GOI) substrate, a glass substrate, or a III-V group compound substrate (such as gallium nitride substrate or gallium arsenide substrate, etc.), etc.

In one embodiment, the first region I and the second region II are two adjacent regions.

Figure 3:
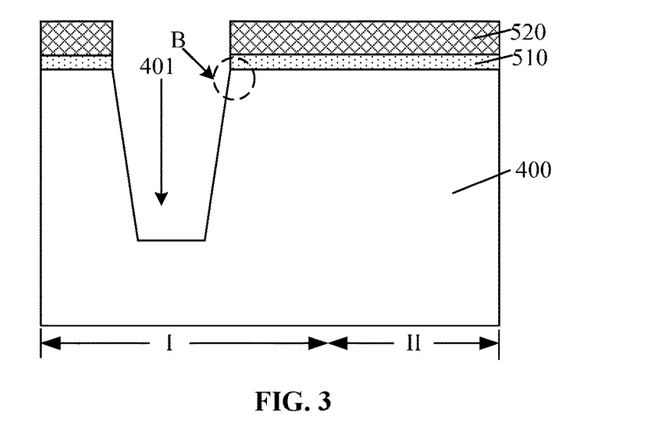

Returning to FIG. 11, after providing the substrate 400, a trench may be formed (S102). FIG. 3 illustrates a corresponding semiconductor structure.

As shown in FIG. 3, a trench 401 is formed in the substrate 400 in the first region I. The trench 401 may provide a spatial space for subsequently forming an isolation structure; and may also provide a spatial space for a subsequent ion implantation process.

The process for forming the trench 401 may include forming a patterned hard mask layer 520 over the substrate 400. The hard mask layer 520 may have an opening (not labeled) exposing a portion of the substrate 400 in the first region I. Then, a partial thickness of the substrate 400 exposed by the opening may be removed along the opening. Thus, the trench 401 may be formed.

The hard mask layer 520 may be used as the etching mask layer for forming the trench 401; and may protect the top surface of the substrate 400. The hard mask layer 520 may also be used to define the stop position of a subsequent planarization process.

The hard mask layer 520 may be made of any appropriate material. In one embodiment, the hard mask layer 520 is made of silicon nitride. Various processes may be used to form the hard mask layer 520, such as a chemical vapor deposition (CVD) process, a physical vapor deposition (PVD) process, or an atomic layer deposition (ALD) process, etc.

Figure 4:
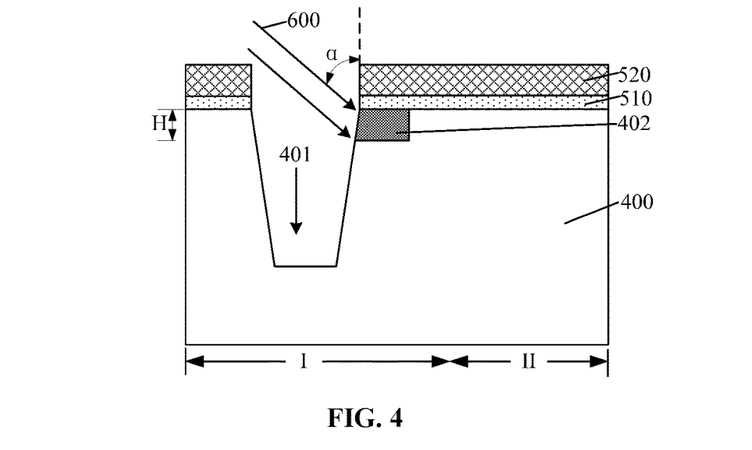

In one embodiment, before forming the hard mask layer 520, as shown in FIG. 4, a buffer layer 510 may be formed on the surface of the substrate 400. The hard mask layer 520 may be formed on the buffer layer 510.

Because the hard mask layer 520 may have a relatively large stress, when the hard mask layer 520 is formed on the surface of the substrate 400 directly, it may be easy to generate dislocations on the surface of the substrate 400. The buffer layer 510 may provide a buffer function when the hard mask layer 520 is formed on the surface of the substrate 400. Thus, the dislocation issue caused by directly forming the hard mask layer 520 on the surface of the substrate 400 may be avoided. Further, the buffer layer 510 may also be used as a stop layer of the subsequent process for removing the hard mask layer 520.

The buffer layer 510 may be made of any appropriate material. In one embodiment, the buffer layer 510 is made of silicon oxide. Various processes may be used to form the buffer layer 510. In one embodiment, a thermal oxidation process is used to form the buffer layer 510.

Correspondingly, the opening in the mask layer 520 may also expose the buffer layer 510. The process for forming the trench 401 may also etch the portion of the buffer layer 510 exposed by the opening.

Various processes may be used to remove the partial thickness of the substrate 400, such as a dry etching process, a wet etching process, or an ion beam etching process, etc. In one embodiment, a plasma dry etching process is used to remove the partial thickness of the substrate 400 to form the trench 401. Specifically, the etching gases of the plasma dry etching process may include HBr, $Cl_2$, and $CF_4$, etc. The flow rate of the etching gases may be in a range of approximately 50 sccm-2000 sccm.

Referring to FIG. 3, the region enclosed by the side surface of the trench 401 adjacent to the second region II and the top surface of the substrate 400 adjacent to the trench 401 may be referred to as a corner region "B".

Returning to FIG. 11, after forming the trenches 401, a compensation doping region may be formed (S103). FIG. 4 illustrates a corresponding semiconductor structure.

As shown in FIG. 4, a compensation doping region 402 is formed on a portion of the side surface of the trench 401 adjacent to the second region II and adjacent to the top surface of the substrate 400. The compensation doping region 402 may be doped with a first type of doping ions.

An isolation structure may be subsequently formed in the trench 401. The compensation doping region 402 may locate at one side of the isolation structure; and may connect with the isolation structure. Further, a drift region may be subsequently formed in the substrate 400 in the first region I. The doping type of the drift region and the doping type of the compensation doping region 402 may be identical. The compensation doping region 402 may be able to compensate the drift region at the corner region enclosed by the side surface of the isolation structure and the top surface of the substrate 400 (the region "B" illustrated in FIG. 3). Such a structure may be able to prevent the excessive diffusion of the doping ions in the drift region at the corner region. Accordingly, the formation of the high resistance region may be avoided.

Specifically, as shown in FIG. 4, a process for forming the compensation doping region 402 in the side surface of the trench 401 at the side adjacent to the second region II may include performing an ion implantation process 600 to the side surface of the trench 401 at the corner region "B" (referring to the FIG. 3).

In one embodiment, the doping depth "H" of the compensation doping region 402 along a direction perpendicular to the surface of the substrate 400 should be an appropriate value. If the doping depth "H" is too small, after subsequently forming a drift region, the compensation doping region 402 may be unable to prevent the excessive ion loss in the corner region "B" of the drift region. That is, the compensation effect of the compensation doping region 402 may be not obvious. Thus, it may be easy to form a high resistance region at the corner region "B"; and it may be difficult to increase the drive current of the semiconductor structure. If the doping depth "H" is too large, the compensation doping region 402 may be in the portion of the drift region that is uneasy to form a high resistance region, it may cause a material waste. Thus, in one embodiment, along the direction perpendicular to the surface of the substrate 400, the doping depth "H" of the compensation doping region 402 may be in a range of approximately 50 Å-500 Å.

In one embodiment, the substrate 400 is used to form a P-type LDMOS device. Thus, the first type of doping ions may be P-type ions. The P-type ions may include B ions, etc. Correspondingly, the ion source of the ion implantation process 600 may be B, $BF_2$ or $C_2B_{10}H_{12}$, etc.

The doping dosage of the ion implantation process 600 may be any appropriate value. If the doping dosage is too small, the doping concentration of the compensation doping region 402 may be too small, the compensation effect of the compensation doping region 402 to the subsequently formed drift region may not be obvious. That is, the compensation doping region 402 may be unable to compensate the drift region at the corner region "B"; and a high resistance region may be still easy to form in the corner region "B". Thus, it may be difficult to increase the drive current of the semiconductor structure. If the doping dosage is too large, the doping concentration of the compensation doping region 402 may be relatively large. Thus, the compensation doping region 402 may be too close to the second region II. The substrate 400 in the second region II may be used to subsequently form a source. Thus, the short channel effect may be more severe.

Referring to FIG. 4, an angle between the direction of the ion beam of the ion implantation process 600 and the surface of the substrate 400 may be referred to as an implanting angle. The implanting angel may be any appropriate value. If the implanting angle is too large, a shadow effect may be obvious, it may be difficult to form the compensation doping region 402 with a desired doping depth in the substrate 400 at the corner region "B" (illustrated in FIG. 3). If the implanting angle is too small, it may be easy to form the compensation doping region 402 in the substrate 400 under the corner region "B". Thus, the concentration doping region 402 may be formed in the un-desired region of the substrate 400.

The doping depth "H" of the compensation doping region 402 may be dependent of the implanting energy of the ion implantation process 600. To allow the doping depth "H" of the compensation doping region 402 to meet the process requirements, the implanting energy of the ion implantation process 600 may be in an appropriate range. Under a same doping depth, the doping energy of the ion implantation process 600 may be determined according to the ion source. The larger the total atomic mass of the ion source is, the larger the implanting energy of the ion implantation process 600 is.

Thus, in one embodiment, to meet the process requirements of the compensation doping region 402, when the ion source of the ion implantation process 600 is B or $BF_2$, the implanting energy of the ion implantation process may be in a range of approximately 5 KeV-100 KeV. For example, in one embodiment, the implanting energy may be in a range of approximately 5 KeV-50 KeV. In some embodiments, the implanting energy may be in a range of approximately 10 KeV-10 KeV. In one embodiment, the doping dosage may be in a range of approximately 5E12 atoms/$cm^2$-2E13 atoms/$cm^2$. In some embodiments, the doping dosage may be in a range of approximately 1E15 atoms/$cm^2$-1E16 atoms/$cm^2$. The implanting angle may be in a range of approximately 0-45°. For example, in one embodiment, the implanting angle may be in a range of approximately 15°-45°. In some embodiments, the implanting angle may be in a range of approximately 0-40°

When the ion source is $C_2B_{10}H_{12}$, the implanting energy may be in a range of approximately 0.5 KeV-100 KeV. For example, in one embodiment, the implanting energy may be in a range of approximately 30 KeV-100 KeV. In some embodiments, the implanting energy may be in a range of approximately 0.5 KeV-20 KeV. The doping dosage may be in a range of approximately 5E12 atoms/$cm^2$-1E14 atoms/$cm^2$. For example, in one embodiment, the doping dosage may be in a range of approximately 5E12 atoms/$cm^2$-1E13 atoms/$cm^2$. In some embodiments, the doping dosage may be in a range of approximately 1E13 atoms/$cm^2$-1E14 atoms/$cm^2$. The implanting angle may be in a range of approximately 15°-45°. That is, the angle "α" between the implanting direction and the normal direction of the surface of the semiconductor substrate 400 illustrated in FIG. 4 may be in a range of approximately 45°-75°. In some embodiments, the implanting angle may be in a range of approximately 0-40°.

In some embodiments, if the ion source of the ion implantation process 600 is $BF_2$, a low dose ion implantation may be combined with the ion implantation process 600. The ion source of the low dose ion implantation process may include C, N or F, etc. The low dose ion implantation process may further enhance the performance of the final semiconductor structure.

Figure 5:
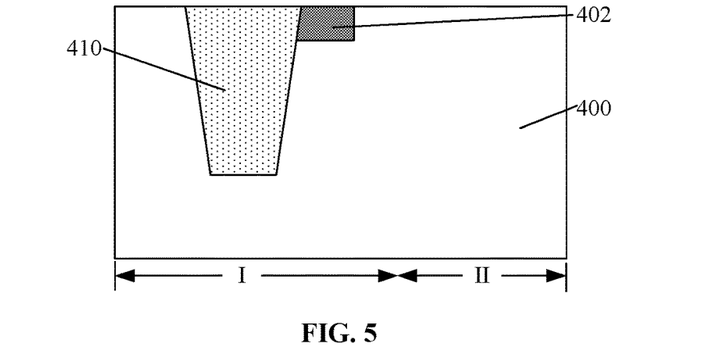

Returning to FIG. 11, after forming the compensation doping region 402, an isolation structure may be formed (S104). FIG. 5 illustrates a corresponding semiconductor structure.

As shown in FIG. 5, an isolation structure 410 is formed in the trench 401 (referring to FIG. 4). The isolation structure 410 may function to increase the conductive path of the LDMOS device. Accordingly, the breakdown voltage of the LDMOS device may be increased.

The isolation structure 410 may be made of any appropriate material, such as silicon oxide, silicon nitride, or silicon oxynitride, etc. In one embodiment, the isolation structure 410 is made of silicon oxide.

Specifically, the process for forming the isolation structure 410 may include forming a precursor isolation film in the trench 401 with a top surface above the top surface of the hard mask layer 520 (referring to FIG. 4); and performing a thermal annealing process on the precursor isolation film to convert the precursor isolation film to an isolation film; removing the portion of the isolation film above the hard mask layer 520; removing the hard mask layer 520; and removing the portions of the remaining isolation film above the substrate 400. Thus, the isolation structure 410 may be formed.

The precursor isolation film may be formed by any appropriate process. In one embodiment, the precursor isolation film is formed by a flowable CVD (FCVD) process. The isolation structure 410 formed by the FCVD process may have a desired filling effect at the corner regions in the trench 401. In some embodiments, the precursor isolation film may be formed by a high aspect ratio CVD process.

The isolation film above the top surface of the hard mask layer 520 may be removed by any appropriate process. In one embodiment, a chemical mechanical polishing (CMP) process may be used to remove the isolation film above the top surface of the hard mask layer 520.

The hard mask layer 520 may be removed by any appropriate process. In one embodiment, the hard mask layer 520 is removed by a wet etching process. The etching solution of the wet etching process may be a phosphorous acid solution.

In one embodiment, the isolation film is made of silicon oxide, the buffer layer 510 (referring to FIG. 4) may also be made of silicon oxide. Thus, the process for forming the isolation film above the substrate 400 may also remove the buffer layer 510 above the substrate 400. Various processes may be used to remove the portion of the isolation film and the portion of the buffer layer 510. In one embodiment, the isolation film and the buffer layer 510 above the substrate 400 are removed by a wet etching process. The etching solution of the wet etching process may be a hydrogen fluoride solution.

Referring to FIG. 5, the isolation structure 410 may be adjacent to the compensation doping region 402. That is, the isolation structure 410 may connect with the compensation doping region 402.

In one embodiment, after forming the trench 401 (referring to FIG. 4), the compensation doping region 402 may be formed firstly, then the isolation structure 410 may be formed. In some embodiments, the isolation structure may be formed firstly, the compensation doping region may be formed in the substrate in the first region at one side of the isolation structure. The compensation doping region may be adjacent to the isolation structure.

Figure 6:
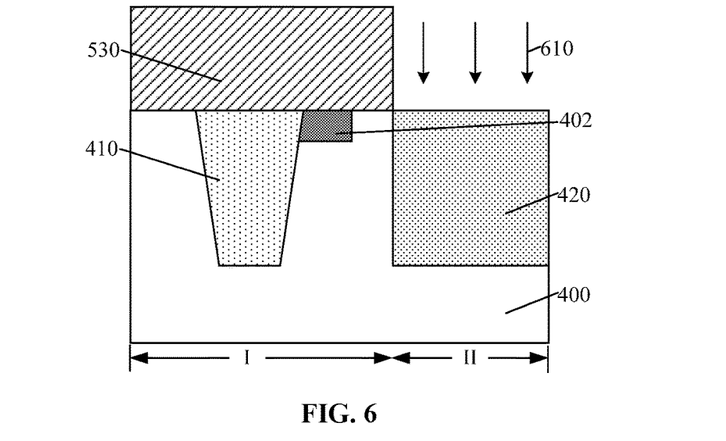

Returning to FIG. 11, after forming the isolation structure 410, a well region may be formed (S105). FIG. 6 illustrates a corresponding semiconductor structure.

As shown in FIG. 6, a well region 420 is formed in the substrate 400 in the second region II. The well region 420 may be doped with a second type of doping ions. The conductive type of the first type of doping ions may be opposite to the conductive type of the second type of doping ions.

The process for forming the well region 420 in the substrate 400 in the second region II may include forming a first pattern layer 530 exposing the substrate 400 in the second region II on the substrate 400; and performing a well ion implantation process 610 on the substrate 400 in the second region II. After forming the well region 420, the first pattern layer 530 may be removed.

In one embodiment, the substrate 400 is used to form a P-type LDMOS device, the first type of doping ions may be P-type ions. Correspondingly, the second type of doping ions may be N-type ions. The second type of doping ions may be P ions. The doping dosage of the second type of doping ions may be in a range of approximately 5E12 atoms/$cm^2$-5E13 atoms/$cm^2$. In some embodiments, the second type of doing ions may be As ions, or Sb ions, etc.

In one embodiment, the first pattern layer 530 may be a photoresist layer. After forming the well region 420, the first pattern layer 530 may be removed by a wet etching process, or a plasma ashing process.

Figure 7:
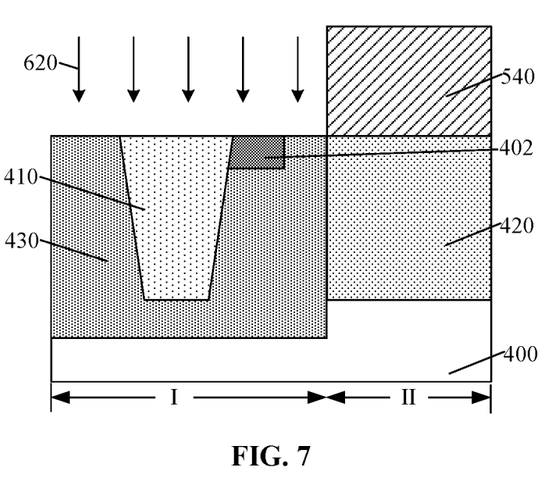

Returning to FIG. 11, after forming the well region 420, a drift region may be formed (S106). FIG. 7 illustrates a corresponding semiconductor structure.

As shown in FIG. 7, a drift region 430 is formed in the substrate 400 in the first region I. The drift region 430 may be doped with a third type of doping ions. A conductive type of the third type of doping ions may be identical to the conductive type of the first type of doping ions.

In one embodiment, the process for forming the drift region 430 in the substrate 400 in the first region I may include forming a second pattern layer 540 exposing the substrate 400 in the first region I on the substrate 400; and performing a drift ion implantation process 620 to the substrate 400 in the first region I. After forming the drift region 430, the second pattern layer 540 may be removed.

In one embodiment, the substrate 400 is used to form a P-type LDMOS device, the first type of doping ions may be P-type ions. Correspondingly, the third type of doping ions may be P-type ions. The third type of ions may be B ions. The doping dosage of the third type of doping ions may be in a range of approximately 5E12 atoms/$cm^2$-5E13 atoms/$cm^2$. In some embodiments, the third type of doing ions may also be Ga ions, or In ions, etc.

In one embodiment, the second pattern layer 540 may be a photoresist layer. After forming the drift region 430, the second pattern layer 540 may be removed by a wet etching process, or a plasma ashing process.

Referring to FIG. 7, after forming the well region 420 and the drift region 430, the well region 420 and the drift region 430 may connect with each other.

In some embodiments, if the well region is formed before forming the drift region, the compensation doping region may be formed after forming the well region and before forming the drift region. Or, the compensation doping region may be formed after forming the drift region.

Further, in some embodiments, if the well region is formed after forming the drift region, the compensation doping region may be formed after forming the drift region and before forming the well region. Or, the compensation doping region may be formed after forming the well region.

Figure 8:
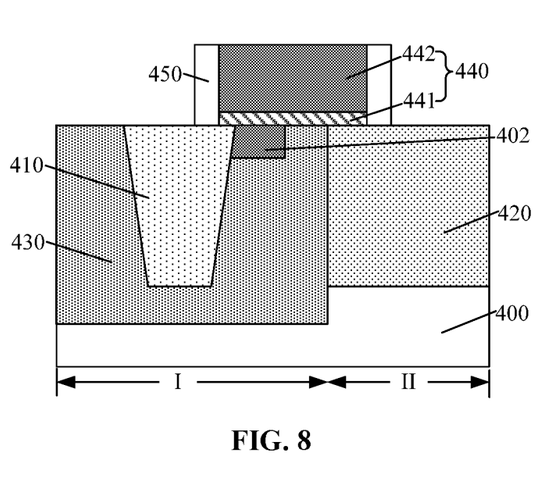

Returning to FIG. 11, after forming the drift region 430, a gate structure may be formed (S107). FIG. 8 illustrates a corresponding semiconductor structure.

As shown in FIG. 8, a gate structure 440 is formed over the boundary region between the first region I and the second region II of the substrate 400. The gate structure 440 may also cover a portion of the isolation structure 410.

In one embodiment, the gate structure 440 may include a gate oxide layer 441 formed on the substrate 400; and a gate electrode layer 442 formed on the gate oxide layer 441. The gate electrode layer 442 may be made of polysilicon.

The process for forming the gate structure 440 may include forming a gate oxide film on the substrate 400; forming a gate electrode film on the gate oxide film; forming a third mask layer (not shown) covering the surface of the boundary region between the first region I and the second region II and the portion of the isolation structure 410 on the gate electrode film; sequentially etching the gate electrode film and the gate oxide film using the third mask layer as an etching mask until the substrate 400 is exposed to form the gate oxide layer 441 and the gate electrode layer 442. The gate oxide layer 441 and the gate electrode layer 442 may form the gate structure 440.

In one embodiment, the third mask layer may be made of photoresist. After forming the gate structure 440, the third mask layer may be removed. The third mask layer may be removed by a wet etching process, or a plasma ashing process, etc.

Further, referring to FIG. 8, after forming the gate structure 440, sidewall spacers 450 may be formed on the side surfaces of the gate structure 440. The sidewall spacers 450 may be used as an implantation mask for subsequently forming source/drain regions in the substrate 400 at two sides of the gate structure 400; and protect the gate structure 400.

The sidewall spacers 450 may be single-layer structures, or multilayer-stacked structures. The sidewall spacers 450 may be made of one or more of silicon oxide, silicon nitride, silicon carbide, silicon carbonitride, silicon carbonoxynitride, boron nitride, boron carbonitride, etc. In one embodiment, the sidewall spacers 450 are single layer structures; and made of silicon nitride.

Figure 9:
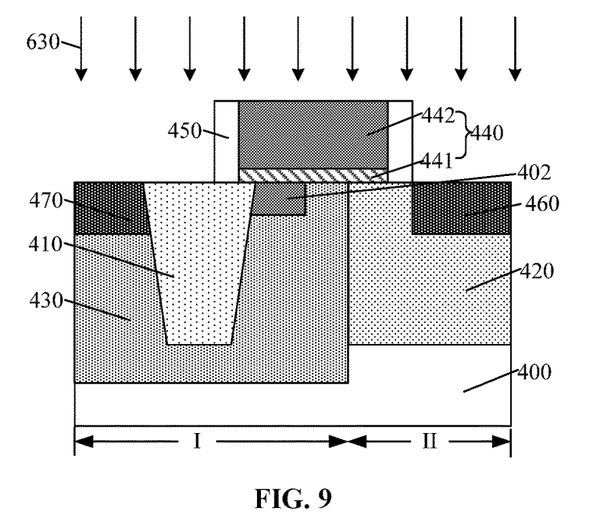

Returning to FIG. 11, after forming the gate structure 440, a source region and a drain region may be formed (S108). FIG. 9 illustrates a corresponding semiconductor structure.

As shown in FIG. 9, a source region 460 is formed in the well region 420 at one side of the gate structure 440; and a drain region 430 is formed in the drift region 430 at another side of the gate structure 440. The source region 460 and the drain region 470 may be doped with a fourth type of doping ions. The conductive type of the fourth type of doping ions may be identical to the conductive type of the third type of doping ions.

The process for forming the source region 460 and the drain region 470 may include forming a fourth pattern layer (not shown) on the substrate 400 exposing the regions corresponding to the source region 460 and the drain region 470 on the substrate 400; and performing a heavily doping process 630 with the fourth type of doping ions to the substrate 400. The source region 460 and the drain region 470 may be formed. The source region 460 may be formed in the well region 420 at one side of the gate structure 440; and the drain region 470 may be formed in the drift region 430 at the other side of the gate structure 440. After forming the source region 460 and the drain region 470, the fourth pattern layer may be removed.

The conductive type of the fourth type of doping ions may be identical to the conductive type of the third type of doping ions. In one embodiment, the conductive type of the fourth type of doping ions is P-type. The fourth type of doping ions may be P ions, As ions, Sb ions, etc. The doping energy of the heavily doping process 630 may be in a range of approximately 15 KeV-45 KeV. The doping dosage may be in a range of approximate $5E13$ atoms/cm$^2$-$2E15$ atoms/cm$^2$.

In one embodiment, the fourth pattern layer may be made of photoresist. After forming the source region 460 and the drain region 470, the fourth pattern layer may be removed. The fourth pattern layer may be removed by any appropriate process, such as a wet etching process, or a plasma etching process, etc.

In one embodiment, the substrate 400 is used to form a P-type LDMOS device. In another embodiment, the substrate may be used to form an N-type LDMOS device. Correspondingly, the conductive type of the second type of doping ions may be P-type, the conductive type of the third type of doping ions, the first type of doping ions and the fourth type of doping ions may be N-type.

During the ion implantation process for forming a compensation doping region in the N-type LDMOS device, the ion source of the ion implantation process may be P. The implanting energy may be in a range of approximately 5 KeV-25 KeV. The doping dosage may be in a range of approximately $5E12$ atoms/cm$^2$-$5E13$ atoms/cm$^2$. The implanting angle may be in a range of approximately 15°-45°.

Thus, in the disclosed embodiments, after forming the trench 401 in the substrate 400 in the first region I (referring to FIG. 3) and before forming the isolation structure 410 (referring to FIG. 5), a compensation doping region 402 (referring to FIG. 4) may be formed in the side surface of the trench 401 adjacent to the second region II. That is, after forming the isolation structure 410, the compensation doping region 402 may be at one side of the isolation structure 410 adjacent to the second region II; and may connect with the compensation doping region 402. Then, a drift region 430 may be formed in the substrate 400 in the first region I (referring to FIG. 7), the conductive type of the doping ions in the drift region 430 may be identical to the conductive type of the doping ions in the compensation doping region 402. The compensation doping region 402 may be able to compensate the drift region 430 at the corner region (the region "B" enclosed by the side surface of the isolation structure 410 and the surface of the substrate 400). The excessive diffusion of the doping ions in the corner region of the drift region 430 to the isolation structure 410 may be prevented. The formation of a high resistance region in the drift region 430 may be prevented. That is, the excessive doping ion loss at the corner region of the drift region 430 to form the high resistance region may be avoided. Thus, the drive current of the semiconductor structure may be improved; and the electrical properties of the semiconductor structure may be improved.

In some embodiments, the disclosed methods may be able to eliminate the source-drain (S/D) e-field impact on the channel regions through the charge transfer in SOI substrate; and improve the drain-induced-barrier-lowering (DIBL) and mobility of the channel region. Further, the disclosed methods may also be able to eliminate the lateral source/drain diffusion into the channel region for forming intrinsic channel.

Thus, a semiconductor structure may be formed by the disclosed methods and processes. FIG. 9 illustrates a corresponding semiconductor structure.

As shown in FIG. 9, the semiconductor structure includes a substrate 400. The substrate 400 may include a first region I and a second region II. The portion of the substrate 400 in the first region I may be used to subsequently form a drift region; and the portion of the substrate 400 in the second region II may be used to subsequently form a well region.

Further, the semiconductor structure may include an isolation structure 410. The isolation structure 410 may be formed in the substrate 400 in the first region I.

Further, the semiconductor structure may also include a compensation doping region 402 formed in the substrate 400 in the first region I, and a portion of the side surface of the trench 401 adjacent to the second region II and adjacent to the top surface of the substrate 400. The compensation doping region 402 may be doped with a first type of doping ions.

The compensation doping region 402 may locate at one side of the isolation structure 410 adjacent to the second region II of the substrate 400; and may connect with the isolation structure 410. The compensation doping region 402 may be doped with a first type of doping ions.

Further, the semiconductor structure may also include a well region 420 formed in the substrate 400 in the second region II. The well region 420 may be doped with a second type of doping ions. The conductive type of the second type of doping ions may be different from the conductive type of the first type of doping ions.

Further, the semiconductor structure may also include a drift region 430 formed in the substrate 400 in the first region I. The drift region 400 may enclose the isolation structure 420 and the compensation doping region 402. The drift region 430 may be doped with a third type of doping ions. The conductive type of the third type of doping ions may be identical to the conductive type of the first type of doping ions.

Further, the semiconductor structure may also include a gate structure 440 formed over the boundary region between the first region I and the second region II. The gate structure 440 may also cover a portion of the isolation structure 410.

Further, the semiconductor structure may also include a source region 460 formed in the well region 420 at one side of the gate structure 440. The source region 460 may be doped with a fourth type of doping ions. The conductive type of the fourth type of doping ions may be identical to the conductive type of the third type of doping ions.

Further, the semiconductor structure may also include a drain region 470 formed in the drift region 430 at another side of the gate structure 440. The drain region 470 may be doped with the fourth type of doping ions. The conductive type of the fourth type of doping ions may be identical to the conductive type of the third type of doping ions.

In one embodiment, the substrate 400 is a silicon substrate. In some embodiments, the substrate 400 may be a germanium substrate, a silicon germanium substrate, a silicon carbide substrate, a silicon on insulator (SOI) substrate, a germanium on insulator (GOI) substrate, a glass substrate, or a III-V group compound substrate (such as gallium nitride substrate or gallium arsenide substrate, etc.), etc.

In one embodiment, the first region I and the second region II are adjacent to each other.

In one embodiment, the semiconductor structure is a P-type semiconductor structure. The P-type semiconductor structure may be a P-type LDMOS device. In another embodiment, the semiconductor structure may be an N-type LDMOS device.

The isolation structure 410 may be formed in the drift region 430. The isolation structure 410 may function to increase the conductive path of the LDMOS device. Accordingly, the breakdown voltage of the LDMOS device may be increased.

In one embodiment, the isolation structure 410 may be made of silicon oxide. In some other embodiments, the isolation structure may be made of silicon nitride, or silicon oxynitride.

In one embodiment, the compensation doping region 402 may locate in the drift region 430; and the compensation doping region 402 may locate in the corner region enclosed by the side surface of the isolation structure 410 and the surface of the substrate 400 in the first region I (the region "B" illustrated in FIG. 3).

The concentration doping region 402 may connect with the isolation structure 410; and the conductive type of the first type of doping ions may be identical to the conductive type of the third type of doping ions. The compensation doping region 402 may be used to compensate the drift region 430 at the corner region. The excessive diffusion of the third type of doping ions into the isolation structure 410 to form a high resistance region at the corner region may be prevented. That is, the loss of the third type of doping ions of the drift region 430 at the corner region may be compensated. Thus, the drive current of the semiconductor structure may be increased.

In one embodiment, the doping depth "H" of the compensation doping region 402 along a direction perpendicular to the surface of the substrate 400 should be an appropriate value (as shown in FIG. 4). If the doping depth "H" is too small, after subsequently forming a drift region, the compensation doping region 402 may be unable to prevent the excessive ion loss in the corner region of the drift region 430. That is, the compensation effect of the compensation doping region 402 may be not obvious. Thus, it may be easy to form a high resistance region at the corner region; and it may be difficult to increase the drive current of the semiconductor structure. If the doping depth "H" is too large, the compensation doping region 402 may be in the portion of the drift region 402 that is uneasy to form a high resistance region, it may cause a material waste. Thus, in one embodiment, along the direction perpendicular to the surface of the substrate 400, the doping depth "H" of the compensation doping region 402 may be in a range of approximately 50 Å-500 Å.

In one embodiment, the substrate 400 is used to form a P-type LDMOS device. Thus, the first type doping ions may be P-type ions. The P-type ions may include B ions.

The doping concentration of the compensation doping region 402 may be any appropriate value. If the doping concentration of the compensation doping region 402 is too small, the compensation effect of the compensation doping region 402 to the drift region 430 at the corner region may not be obvious. That is, the compensation doping region 402 may be unable to compensate the drift region 430 at the corner region "B"; and a high resistance region may be still easy to form in the corner region "B". Thus, it may be difficult to increase the drive current of the LDMOS device. If the doping concentration of the compensation doping region 420 is too large, the compensation doping region 402 may be too close to the second region II. The source region 460 may be formed in the substrate 400 in the second region II. The short channel effect may be more severe. Thus, in one embodiment, the doping concentration of the compensation doping region 402 may be in a range of approximately 5E12 atoms/cm$^3$-2E13 atoms/cm$^3$.

In one embodiment, the conductive type of the first type of doping ions is different from the conductive type of the second type of doping ions. The conductive type of the third type of doping ions is identical to the conductive type of the first type of doping ions.

Correspondingly, the conductive type of the second type of doping ions may be N-type; and the conductive type of the second type of doping ions may be P-type ions. The doping concentration of the well region 420 may be in a range of approximately 2E18 atoms/cm$^3$-2E19 atoms/cm$^3$. In some embodiments, the second type of doping ions may be As ions, or Sb ions, etc.

Correspondingly, the third type of doping ions may be P-type ions. The third type of doping ions may be B ions. The doping concentration of the drift region 430 may be 5E18 atom/cm$^3$-5E19 atom/cm$^3$. In some embodiments, the third type of doping ions may be Ga ions, or In ions, etc.

In one embodiment, the well region 420 may connect with the drift region 430.

In one embodiment, the gate structure 440 may include a gate oxide layer 441 formed on the substrate 400; and a gate electrode layer 442 formed on the gate oxide layer 441. The gate electrode layer 442 may be made of polysilicon.

Further, referring to FIG. 9, in one embodiment, the semiconductor structure may also include sidewall spacers 450 formed on side surfaces of the gate structure 440. The sidewall spacers 450 may be used as an implantation mask for subsequently forming source/drain regions in the substrate 400 at two sides of the gate structure 400; and protect the gate structure 400.

The sidewall spacers 450 may be single-layer structures, or multilayer-stacked structures. The sidewall spacers 450 may be made of one or more of silicon oxide, silicon nitride, silicon carbide, silicon carbonitride, silicon carbonoxynitride, boron nitride, boron carbonitride, etc. In one embodiment, the sidewall spacers 450 are single layer structures; and made of silicon nitride.

The conductive type of the fourth type of doping ions may be identical to the conductive type of the third type of doping ions.

In one embodiment, the conductive type of the fourth type of doping ions is P-type. The fourth type of doping ions may be P ions, As ions, Sb ions, etc. The doping concentration of the fourth type of doping ions in the source region 460 and the drain region 470 may be in a range of approximate 5E13 atoms/cm$^3$-2E15 atoms/cm$^3$.

In one embodiment, the semiconductor structure is a P-type LDMOS device. In another embodiment, the semiconductor structure may be an N-type LDMOS device.

Correspondingly, the second type of doping ions may be P-type ions; and the third type of doping ions, the first type of doping ions and the fourth type of doping ions may be N-type ions. Specifically, the first type of doping ions are P ions. The doping concentration of the compensation doping region 402 may be in a range of approximately 5E13 atoms/cm$^3$-2E15 atoms/cm$^3$.

Figure 10:
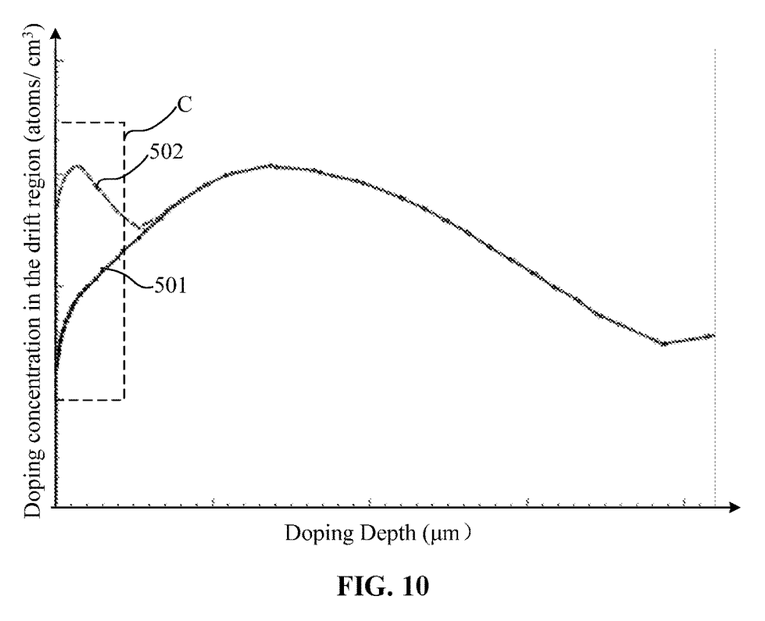
FIG. 10 illustrates a correlation between the doping concentration and the doping depth in the drift region of an exemplary semiconductor structure consistent with the disclosed embodiments.

FIG. 10 illustrates an exemplary diagram of the correlation between the doping concentration of the drift region 430 and the doping depth of the drift region 430. The abscissa of the diagram is used to represent the doping concentration of the drift region 430; and the ordinate of the diagram is used to represent the doping depth of the drift region 430. The curve 501 in the FIG. 10 illustrates the correlation between the doping concentration of the doping depth of the drift region 430 when there is no compensation doping region. The curve 502 in the FIG. 10 illustrates the correlation between the doping concentration of the doping depth of the drift region 430 when the compensation doping region 402 is formed the drift region 430.

As shown in the region "C" in FIG. 10, when there is no doping concentration, in a region with a small doping depth (i.e., the corner region enclosed by the side surface of the isolation structure and the surface of the substrate 400 in the first region I), because doping ions of the drift region may be easy to diffuse into the isolation structure 410, the doping concentration of the drift region 430 at the corner region may be relatively small. When the compensation doping region 402 is formed in the drift region 430, the compensation doping region 402 may compensate the drift region 430 at the corner region. Thus, the doping concentration of the drift region at the corner region may be relatively large.

Thus, the disclosed semiconductor structure may include a compensation doping region 402 formed in the substrate 400 in the first region I. The compensation doping region 402 may be formed in the substrate 400 at the side of the isolation structure 410 close to the second region II. The compensation doping region 402 may connect with the isolation structure 410. The conductive type of the doping ions in the compensation doping region 402 may be identical to the conductive type of the doping ions in the drift region 430. The compensation doping region 402 may compensate the drift region 430 at the corner region (the region "B" illustrated in FIG. 3) enclosed by the side surface of the isolation structure 410 and the surface of the substrate 400 in the first region I. The excessive ion diffusion of the drift region 430 at the corner region to the isolation structure 410 to form a high resistance region may be avoided. That is, the excessive ion loss in the drift region 430 at the corner region to form a high resistance region may be avoided. Thus, the drive current of the semiconductor structure may be increased; and the electrical properties of the semiconductor structures may be improved.

Thus, according to the disclosed methods, after forming a trench in the substrate in the first region I and before forming an isolation structure, a compensation doping region may be formed in the side surface of the trench close to the second region II. That is, after forming the isolation structure, the compensation doping region may be at one side of the isolation structure close to the second region II and connect with the compensation doping region. Then, a drift region may be formed in the substrate in the first region I. The conductive type of the doping ions in the drift region may be identical to the conductive type of the doping ions in the compensation doping region. The compensation doping region may be able to compensate the drift region at the corner region enclosed by the side surface of the isolation structure and the surface of the substrate. The excessive diffusion of the doping ions in the corner region of the drift region to the isolation structure may be prevented. The formation of a high resistance region in the drift region may be prevented. That is, the excessive doping ion loss at the corner region of the drift region to form the high resistance region may be avoided. Thus, the drive current of the semiconductor structure may be improved; and the electrical properties of the semiconductor structure may be improved.

Correspondingly, the disclosed semiconductor structure may include a compensation doping region formed in the substrate in the first region I. The compensation doping region may be formed in the substrate at the side of the isolation structure close to the second region II. The compensation doping region may connect with the isolation structure. The conductive type of the doping ions in the compensation doping region may be identical to the conductive type of the doping ions in the drift region. The compensation doping region may compensate the drift region at the corner region enclosed by the side surface of the isolation structure and the surface of the substrate in the first region I. The excessive ion diffusion of the drift region at the corner region to the isolation structure to form a high resistance region may be avoided. That is, the excessive ion loss of the drift region at the corner region to form a high resistance region may be avoided. Thus, the drive current of the semiconductor structure may be increased; and the electrical properties of the semiconductor structures may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a semiconductor structure, comprising:
   providing a substrate having a first region and a second region;
   forming a trench in the substrate in the first region;
   forming a compensation doping region in a side surface of the trench adjacent to the second region, including performing an ion implantation process on a corner region enclosed by the side surface of trench and a top surface of the substrate in the second region, wherein:
      an ion source of the ion implantation process includes one of B, $BF_2$, and $C_2B_{10}H_{12}$;
      when the ion source is B or $BF_2$;
         an implanting energy is in a range of approximately 5 KeV-100 KeV;
         an implanting dosage is in a range of approximately 5E12 atoms/cm$^2$-2E13 atoms/cm$^2$; and
         an implanting angle is in a range of approximately 15°-45°;
   forming an isolation structure in the trench;
   forming a well region in the substrate in the second region;
   forming a drift region in the substrate in the first region;
   forming a gate structure over the substrate in a boundary region between the first region and the second region, and covering the compensation doping region and a portion of the isolation structure; and
   forming a source region in the well region at one side of the gate structure and a drain region in the drift region at another side of the gate structure.

2. The method according to claim 1, wherein the substrate is used to form a P-type semiconductor structure.

3. A method for fabricating a semiconductor structure, comprising:
   providing a substrate having a first region and a second region;
   forming a trench in the substrate in the first region;
   forming a compensation doping region in a side surface of the trench adjacent to the second region, including performing an ion implantation process on a corner region enclosed by the side surface of trench and a top surface of the substrate in the second region, wherein:
      the ion source includes P;
      an implanting energy is in a range of approximately 5 KeV-25 KeV;
      an implanting dosage is in a range of approximately 5E12 atoms/cm$^2$-5E13 atoms/cm$^2$; and
      an implanting angle is in a range of approximately 15°-45°;
   forming an isolation structure in the trench;
   forming a well region in the substrate in the second region;
   forming a drift region in the substrate in the first region;
   forming a gate structure over the substrate in a boundary region between the first region and the second region, and covering the compensation doping region and a portion of the isolation structure; and
   forming a source region in the well region at one side of the gate structure and a drain region in the drift region at another side of the gate structure.

4. The method according to claim 1, wherein:
the first region is adjacent to the second region; and
the well region connects with the drift region after forming the drift region and the well region.

5. The method according to claim 1, wherein forming the trench in the substrate in the first region comprises:
   forming a patterned hard mask layer having an opening exposing a portion of the substrate in the first region on the substrate; and
   removing a partial thickness of the substrate using the patterned hard mask layer as an etching mask.

6. The method according to claim 5, wherein:
the partial thickness of the substrate is removed by a plasma dry etching process.

7. The method according to claim 1, wherein:
a doping depth of the compensation doping region along a direction perpendicular to the substrate is in a range of approximately 50 Å-500 Å.

8. The method according to claim 1, wherein:
the compensation doping region is doped with a first type of doping ions;
the well region is doped with a second type of doping ions;
a conductive type of the second type of doping ions is opposite to a conductive type of the first type of doping ions;
the drift region is doped with a third type of doping ions;
a conductive type of the third type of doping ions is identical to the conductive type of the first type of doping ions;
the source region and the drain region are doped with a fourth type of doping ions; and
a conductive type of the fourth type of doping ions is identical to the conductive type of the third type of doping ions.

9. The method according to claim 1, wherein:
the compensation doping region is formed in a surface area of the drift region between the isolation structure and the well region.

10. The method according to claim 9, wherein:
the compensation doping region is in direct contact with a top portion of the isolation structure on a side closer to the gate structure.

11. The method according to claim 3, wherein:
the first region is adjacent to the second region; and
the well region connects with the drift region after forming the drift region and the well region.

12. The method according to claim 3, wherein forming the trench in the substrate in the first region comprises:
   forming a patterned hard mask layer having an opening exposing a portion of the substrate in the first region on the substrate; and
   removing a partial thickness of the substrate using the patterned hard mask layer as an etching mask.

13. The method according to claim 12, wherein:
   the partial thickness of the substrate is removed by a plasma dry etching process.

14. The method according to claim 3, wherein:
   a doping depth of the compensation doping region along a direction perpendicular to the substrate is in a range of approximately 50 Å-500 Å.

15. The method according to claim 3, wherein:
   the compensation doping region is doped with a first type of doping ions;
   the well region is doped with a second type of doping ions;
   a conductive type of the second type of doping ions is opposite to a conductive type of the first type of doping ions;
   the drift region is doped with a third type of doping ions;
   a conductive type of the third type of doping ions is identical to the conductive type of the first type of doping ions;
   the source region and the drain region are doped with a fourth type of doping ions; and
   a conductive type of the fourth type of doping ions is identical to the conductive type of the third type of doping ions.

16. The method according to claim 3, wherein:
   the compensation doping region is formed in a surface area of the drift region between the isolation structure and the well region.

17. The method according to claim 16, wherein:
   the compensation doping region is in direct contact with a top portion of the isolation structure on a side closer to the gate structure.

* * * * *